United States Patent [19]

Tsujimoto

[11] Patent Number: 4,633,105
[45] Date of Patent: Dec. 30, 1986

[54] BOOTSTRAP TYPE OUTPUT CIRCUIT

[75] Inventor: Akira Tsujimoto, Tokyo, Japan

[73] Assignee: NEC Corporation, Tokyo

[21] Appl. No.: 686,863

[22] Filed: Dec. 27, 1984

[30] Foreign Application Priority Data

Dec. 27, 1983 [JP] Japan .................................. 58-250110

[51] Int. Cl.$^4$ .................... H03K 5/135; H03K 19/017; H03K 19/096; H03K 4/58
[52] U.S. Cl. .................................... 307/482; 307/578; 307/270; 307/269
[58] Field of Search ................ 307/482, 578, 451, 450, 307/453, 584, 571, 270, 269

[56] References Cited

U.S. PATENT DOCUMENTS

| | | | |
|---|---|---|---|
| 3,774,055 | 11/1973 | Bapat | 307/482 X |
| 4,443,714 | 4/1984 | Nakano et al. | 307/578 X |
| 4,443,720 | 4/1984 | Takemae | 307/578 |
| 4,447,745 | 5/1984 | Takemae et al. | 307/578 X |

Primary Examiner—Stanley D. Miller
Assistant Examiner—David R. Bertelson
Attorney, Agent, or Firm—Sughrue, Mion, Zinn, Macpeak and Seas

[57] ABSTRACT

An improved bootstrap output circuit which can operate stably without being influenced by noise and voltage fluctuation of the substrate. A delay circuit includes a first MIS transistor having a gate receiving a first input signal, a drain connected to a power supply and a source connected to a first node. A second MIS transistor has a gate receiving a second input signal, a drain connected to the first node and a source connected to the ground potential. A third MIS transistor has a gate receiving the second input signal, a drain connected to the power supply and a source connected to a second node. A fourth MIS transistor has a gate connected to the first node, a drain connected to the second node and a source held at the ground potential. A fifth MIS transistor has a gate connected to the second node, a drain connected to the first node and a source connected to the first input signal. The delay circuit generates an output signal from the second node the level of which falls with a predetermined delay after the rise of the first input signal. A driver circuit including a bootstrap circuit makes use of the output at the second node for controlling the charge operation of the bootstrap capacitor.

13 Claims, 9 Drawing Figures

BOOTSTRAP TYPE OUTPUT CIRCUIT

BACKGROUND OF THE INVENTION

The present invention relates to a bootstrap type output circuit composed of field effect transistors.

Bootstrap type output circuits (bootstrap circuits) have been widely utilized in various fields because the circuits can produce signals at the level of a power supply voltage without any level reduction. Bootstrap circuits generally consist of an output (buffer) section, including an output transistor connected between an output terminal and a power voltage terminal with a bootstrap capacitor coupled to the gate of the output transistor, and a delay control section for controlling charging operation of the capacitor in response to an input signal. The delay control section provides an output signal to initiate the charging operation of the capacitor a predetermined period after the input signal changes from a first low level to a second high level. After the predetermined period, the charge stored in the capacitor is superimposed on the gate potential of the output transistor so that the output transistor is driven into the saturated region to generate the power voltage level at the output terminal.

In the conventional circuit, the delay control section is kept at a high impedance state and is likely to be affected by noise from the outside, fluctuation of a substrate biasing voltage, or the like. In that case, it becomes difficult to effectively charge the capacitor, thereby adversely affecting the operation of the output circuit.

SUMMARY OF THE INVENTION

It is an object of the present invention to provide an improved bootstrap type output circuit which can operate stably.

The bootstrap output circuit according to the present invention is of the type having a delay circuit including a first MIS transistor having a gate receiving a first input signal, a drain connected to a power supply, and a source connected to a first node, a second MIS transistor having a gate receiving a second input signal, a drain connected to the first node and a source connected to the ground potential, a third MIS transistor having a gate receiving the second input signal, a drain connected to the power supply and a source connected to a second node, and a fourth MIS transistor having a gate connected to the first node, a drain connected to the second node and a source connected to the ground potential. The delay circuit generates an output from the second node which falls with a prdetermined delay after the rise of the first input signal. A driver circuit includes a bootstrap circuit which makes use of the output at the second node as a grounding-side control signal.

A level control circuit is responsive to the output of the delay circuit for operatively setting the level of the first node to the level of the first input signal.

According to the present invention, after the second signal has fallen in level but before the first input becomes high, the level of the first node is stably maintained at a low level by the level control circuit. Therefore, a high impedance, floating state of the first node is effectively avoided. Therefore, when the first input signal changes to a high level, the level of the first node can be quickly raised through the first transistor and the level control circuit. The output circuit according to the present invention can stably operate without being influenced by noise and voltage fluctuations of the substrate.

DETAILED DESCRIPTION OF THE INVENTION

Figure 1:
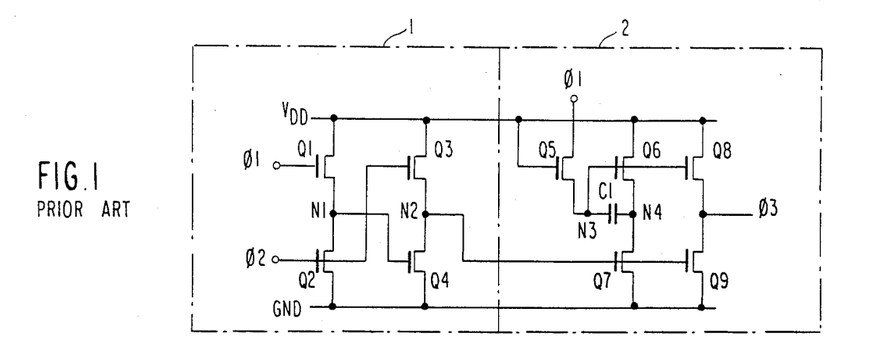
FIG. 1 is a circuit diagram showing one example of a bootstrap circuit according to the prior art.

FIG. 1 is a circuit diagram of an example of a conventional bootstrap circuit. More specifically, the circuit shown in FIG. 1 is used as a buffer circuit which is a typical example of a dynamic circuit constituted by MIS transistors which are in this case n-channel type MOS transistors (referred to as "MOST", hereinunder). The circuit includes a delay control section 1, composed of MOSTs $Q_1$, $Q_2$, $Q_3$ and $Q_4$, and a driver circuit 2, composed of MOSTs $Q_5$, $Q_6$, $Q_7$, $Q_8$ and $Q_9$.

Figure 4:
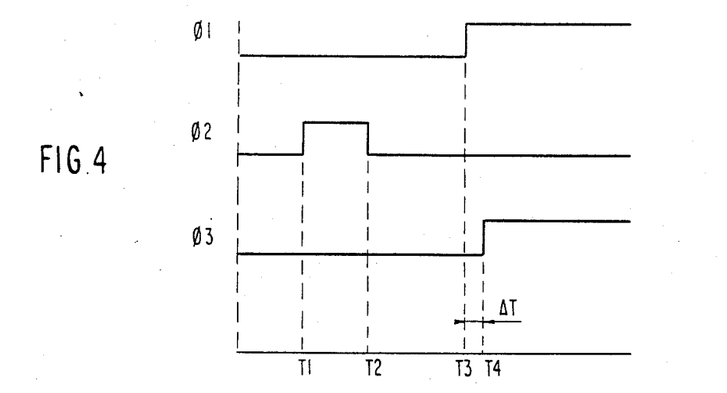
FIG. 4 is a time chart showing the operation of the circuits shown in FIGS. 1, 2 and 3.

FIG. 4 shows the time chart of the input signals $\phi_1$, $\phi_2$ and the output signal $\phi_3$ as they would appear in the prior art as well as in the circuits of the invention. The input signal $\phi_2$ is first changed to a high level at time $T_1$. MOST $Q_3$ is turned on thereby charging node $N_2$ to a level which is smaller than the poewr supply $V_{DD}$ by a threshold voltage $V_T$ of MOST $Q_3$, i.e., "$V_{DD}-V_T$". In consequence, MOSTs $Q_7$ and $Q_9$ are turned on and hold a node $N_4$ and the output signal $\phi_3$ at the low level. $\phi_2$ changes to a low level at a time $T_2$. The input signal $\phi_1$ is changed to a high level at time $T_3$ permitting node $N_3$ to be charged to the $V_{DD}-V_T$ level through MOST $Q_5$. MOSTs $Q_6$ and $Q_8$ are turned on with the result that MOSTs $Q_6$, $Q_7$, $Q_8$ and $Q_9$ conduct current from the power supply $V_{DD}$ to the ground GND during a period $\Delta T$.

The node $N_2$ is maintained at the $V_{DD}-V_T$ level until the potential of the node $N_1$ exceeds the threshold value $V_T$ of the MOST $Q_4$. Thus when MOST $Q_1$ is turned on the level of the node $N_4$ is initially maintained at a low level, determined by the ratio of "ON" resistances of MOSTs $Q_6$ and $Q_7$, which ratio generally ranges between 1:3 and 1:5. Representing the electrostatic capacitance of the capacitor C1 by Cc1(F) and the potential difference between the nodes $N_3$ and $N_4$ by $\Delta V(V)$, the capacitance C1 is charged with electrostatic charge which is expressed by $Q(c)=Cc1 \times \Delta V$.

As the level of the node $N_1$ rises to turn on MOST $Q_4$ and lower the level of the node $N_2$ to ground potential GND, MOSTs $Q_7$ and $Q_9$ will be turned off. As a result, the potential of the node $N_4$ changes from GND to $V_{DD}-V_T$ while the potential of the node $N_3$ is raised by a voltage given as "Q/(Capacitance of node $N_3+Cc1$)". At the same time, the level of the gates of the MOSTs $Q_{66}$ and $Q_8$ is raised to the level above the power supply $V_{DD}$ and the potentials of the node $N_4$ and the output signal $\phi_3$ are raised to the same level as the power supply $V_{DD}$ with a delay $\Delta T$ after the rise of the potential of the input signal $\phi_1$.

Figure 7:
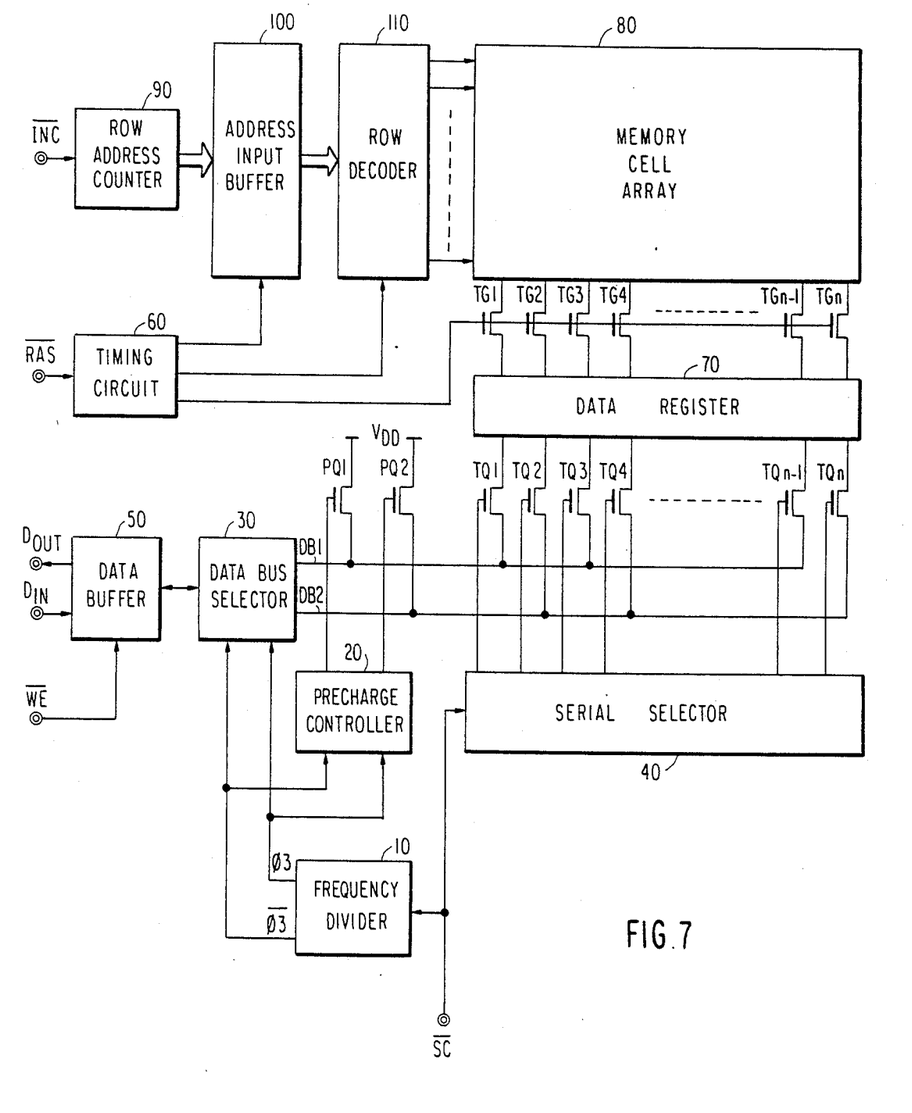
FIG. 7 is a block diagram of a RAM of dynamic type showing an example of an application of the invention.
Figure 8:
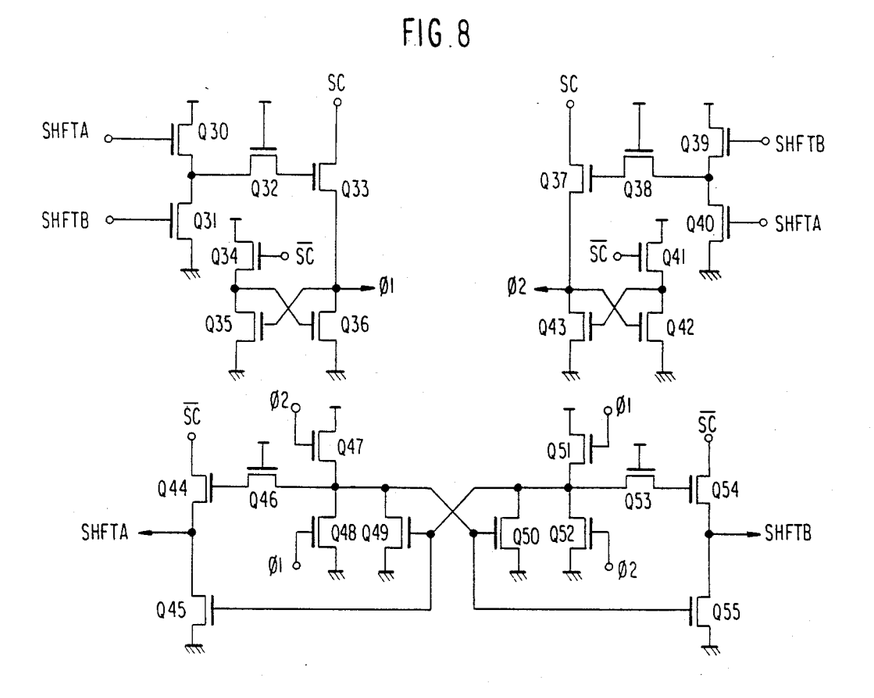
FIG. 8 is a circuit diagram of a frequency dividing circuit shown in FIG. 7.

A circuit of the type shown in FIG. 1 is advantageously used in the output stage of a dynamic-type frequency dividing circuit which is adapted to divide externally supplied clock signals to produce an internal circuit controlling clock signal of a level substantially equal to the voltage of a power supply. An example of the apparatus which would include such a frequency dividing circuit is shown in FIG. 7. More specifically, FIG. 7 shows a dynamic RAM which is incorporated in a television receiver of a digital control type and adapted for writing and reading video information obtained through an A/D conversion of the video signal. The system of FIG. 7 as well as the frequency divider of FIG. 8 is illustrated only to show one example of the application of bootstrap circuits of the type shown in FIGS. 1, 2, 3 and 5 herein.

In the data writing operation, the video signals obtained in each horizontal scanning period are sujected to A/D conversion, which is conducted in accordance with a sampling signal of a predetermined frequency. The converted signals are successively fed to a data input terminal $D_{IN}$. The digital video information thus supplied through the input terminal $D_{IN}$ is supplied to a data BUS selector 30 through a data buffer 40 when the write enable terminal $\overline{WE}$ is at the active level, and is applied alternately on a bit-by-bit basis to data BUS lines $DB_1$ and $DB_2$. A serial access control signal $\overline{SC}$ of the same frequency as the sampling signal is supplied to the terminal $\overline{SC}$ so that the serial selector 40 operates to sequentially turn on the transfer gates $TQ_1$ to $TQ_n$. Consequently, the data bits of the digital video information in each horizontal scanning period are stored in corresponding bit locations in a data register 70.

The digital video information stored in a data register 70 is written in a memory cell array 80 in accordance with addresses which are determined by a row address counter 90. The content of counter 90 is incremented by "1" in response to receipt of each row address increment signal delivered through a terminals $\overline{INC}$.

The row address stroke signal to the terminal $\overline{RAS}$ is activated within the first blanking period in each horizontal scanning period so that an address input buffer 100 and a row decoder 110 are activated by the timing circuit 60. In consequence, the row decoder 110 selects one of the row lines (word lines) in accordance with the content of the row address counter 90. Furthermore, the timing circuit 60 activates transfer gates $TG_1$ and $TG_2$ so that the data bits in the data register 70 are written in corresponding memory cells connected to the selected row line.

In a data reading operation, the row address strobe signal $\overline{RAS}$ is activated within the initial blanking period in each horizontal scanning period so that the data in the memory cells selected by the row decoder 110 are entered into the data register 70. The transfer gates $TQ_1$ to $TQ_n$ are successively turned on in accordance with the serial control signal $\overline{SC}$ so that the data bits in the data register 70 appear on the data buses $DB_1$ and $DB_2$, alternately. The data BUS selector 30 alternately selects the data buses $DB_1$ and $DB_2$ and supplies the data bits to the data buffer 50. The terminal $\overline{WE}$ is held at the level activated for reading, so the data supplied to the data buffer 50 appears on the data terminal $D_{OUT}$.

The inputting of serial data to the bit locations of the data register 70, as well as the outputting of serial data from the same, has to be completed within the horizontal scanning period in synchronism with the serial control signal to be supplied to the terminal $\overline{SC}$. Therefore, the serial control signal has an extremely high frequency. On the other hand, in order to conduct the inputting and outputting of the data through the data buses $DB_1$ and $DB_2$, it is necessary to precharge $DB_1$ and $DB_2$ to the voltage $V_{DD}$ before connecting the same to the transfer gates $TQ_1$ to $TQ_n$. This precharging requires a considerable time because the storage capacitances of $DB_1$ and $DB_2$ are large. If only one data bus were used, the transfer gates $TQ_1$ to $TQ_2$ would become conductive before the single data bus is sufficiently precharged, thereby adversely affecting the input and output operation. To obviate this problem, two data buses $DB_1$ and $DB_2$ are used in combination with precharging transistors $PQ_1$ and $PQ_2$, which are turned on alternately by a precharge controller 20, in such a manner that when the data appears in one (e.g., $DB_1$) of two data buses, the other (E.G., $DB_2$) is precharged. when one (e.g., $DB_1$) of two data buses is being precharged, the data bus selector 30 selects the other (e.g., $DB_2$). With this arrangement, it is possible to effect the inputting and outputting of the serial data without fail at the same speed as the serial control signal $\overline{SC}$ even when this signal is at a considerably high frequency.

A frequency divider 10 is intended for producing clock signals which are required in the control of the precharge transistors $PQ_1$ and $PQ_2$ in the precharge controller 20, as well as in the control of data bus selection by the data bus selector 30. The frequency divider 10 is adapted to divide the serial control signal $\overline{SC}$ into ½ and to deliver the output $\phi_3$ and its complementary output $\overline{\phi_3}$ to the precharge controller 20 and the data bus selector 30. Since the internal clock signals $\phi_3$ and $\overline{\phi_3}$ are obtained through frequency division of the signal $\overline{SC}$ by a factor of 2, these signals alternately have high and low levels in each period of the signal $\overline{SC}$, thus attaining the above-described operation of the circuit.

If the frequency divider 10 is composed of a static-type flip-flop, D.C. electric current flows between the power supply terminals through one of two cross-coupled transistors, which is in the conductive state, as is well known to those skilled in the art. Consequently, the frequency divider 10 consumes a large amount of electric power. Such large power consumption is contrary to the advantage of having a dynamic-type memory.

Therefore, it is preferred to use a dynamic-type frequency divider as shown in FIG. 8.

Such a dynamic-type frequency divider includes a bootstrap circuit (not shown in FIG. 8) of the type shown in FIGS. 1 or 2, or preferably of the type shown in FIGS. 3 and 5, described later.

Figure 9:
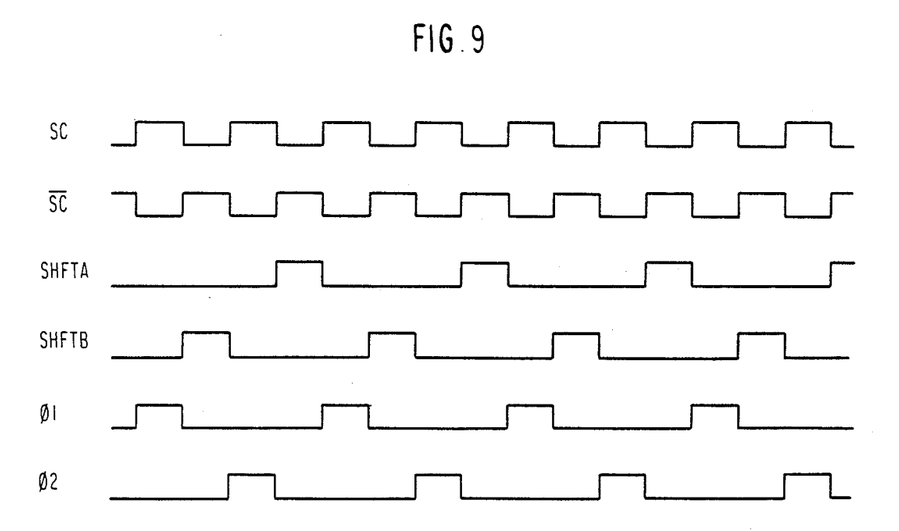
FIG. 9 is a timing chart illustrating the operation of the circuit shown in FIG. 8.

FIG. 9 shows waveforms appearing in the frequency divider shown in FIG. 8. A signal $\overline{SC}$ obtained through inversion of the serial control signal $\overline{SC}$ is used for the purpose of a dynamic-type frequency dividing operation. It is assumed here that, in the initial state, the points of connection between MOSTs 30 and $Q_{31}$ and between MOSTs $Q_{47}$ and $Q_{48}$ have been precharged to $V_{DD}$. As the signal $\overline{SC}$ is changed to low level, i.e., as the signal $\overline{SC}$ is changed to high level, MOST $Q_{33}$ is turned on so that the signal $\phi_1$ is changed to a high level. Since the point of connection between MOSTs $Q_{39}$ and $Q_{40}$ is maintained at the low level, the signal $\phi_2$ is held at the low level. The high level signal $\phi_1$ turns the MOSTs $Q_{48}$ and $Q_{51}$ on but both the signals SHFTA and SHFTB are held at a low level because the signal $\overline{SC}$ is maintained at a low level. As the signal $\overline{SC}$ is inverted to a high level, the MOST $Q_{54}$ is turned on so that the signal SHFTB is changed to a high level. At the same time, MOSTs $Q_{34}$, $Q_{36}$, $Q_{41}$ and $Q_{43}$ are turned on so that the signal $\phi_1$ is inverted to a low level, while the signal $\phi_2$ still remains at low level. $\phi_1$ and $\phi_2$ are inputs to the circuit of FIG. 1. The gate of MOST $Q_{45}$ is maintained at a high level, so that the signal SHFTA remains at a low level. Then, as the signal $\overline{SC}$ is changed to a low level, the MOST $Q_{37}$ is turned on so that the signal $\phi_2$ is inverted to a high level. Since the MOST $Q_{47}$ is turned on by the high level of signal $\phi_2$, the signal SFTB is inverted to a low level. The signals $\phi_1$ and SHFTA are held at the low level. When the signal $\overline{SC}$ resumes the high level, the MOST $Q_{44}$ is turned on and the signal SHFTA is inverted to a high level. Since both the MOSTs $Q_{41}$ and $Q_{43}$ are turned on, the signal $\phi_2$ is inverted to a low level. Signals $\phi_1$ and SHFTB are maintained at the low level. The waveforms of these signals are shown in FIG. 9.

In this frequency divider of the dynamic type, no series connected transistors are simultaneously conducting to conduct current between the power supply terminals, so that the electric power consumption is considerably small.

Signals $\phi_1$ and $\phi_2$ are substantially the same as those obtained through ½ frequency-division of the signals SC and $\overline{SC}$, respectively. The high level of these signals is equal to that obtained by subtracting the threshold voltage $V_T$ of the MOST from the power supply voltage $V_{DD}$. It is not appropriate to use the signals $\phi_1$ and $\phi_2$ as the signals $\phi_3$ and $\overline{\phi_3}$ in FIG. 7, respectively. Therefore, the signals $\phi_1$ and $\phi_2$ are delivered as the inputs $\phi_1$ and $\phi_2$ in FIG. 1 so that a signal $\phi_3$ having the power supply voltage $V_{DD}$ as the high level is obtained, as will be clear from the description of the operation previously given in connection with FIG. 1. The inverted signal $\overline{\phi_3}$ is obtained by supplying the signals $\phi_2$ and $\phi_1$ of FIG. 9 to the input terminals $\phi_1$ and $\phi_2$ of FIG. 1.

As will be understood from the circuit operation explained in connection with FIG. 8, as well as from the timing or waveform chart shown in FIG. 9, the presence of a period in which both the signals $\phi_1$ and $\phi_2$ are at a low level is inevitable in a frequency dividing circuit of dynamic operation type. In addition, the period in which both signals $\phi_1$ and $\phi_2$ are at the low level depends on the frequency of the series control signals $\overline{SC}$ which is applied externally.

Referring back to FIG. 1, in the period between moments $T_2$ and $T_3$ (see FIG. 4) in which both the input signals $\phi_1$ and $\phi_2$ are at the low level, the node $N_1$ will be at a low level in the high-impedance state. In this state, due to reasons such as fluctuation of the substrate potential, the level of the node $N_1$ is raised. If this level exceeds the threshold level of the MOST $Q_4$, then when $\phi_2$ goes higher and turns on $Q_3$, the level at $N_2$ will not go to the high level as required for the bootstrap operation, but will be at a low level, near ground. Thus, the circuit will not operate correctly.

Figure 2:
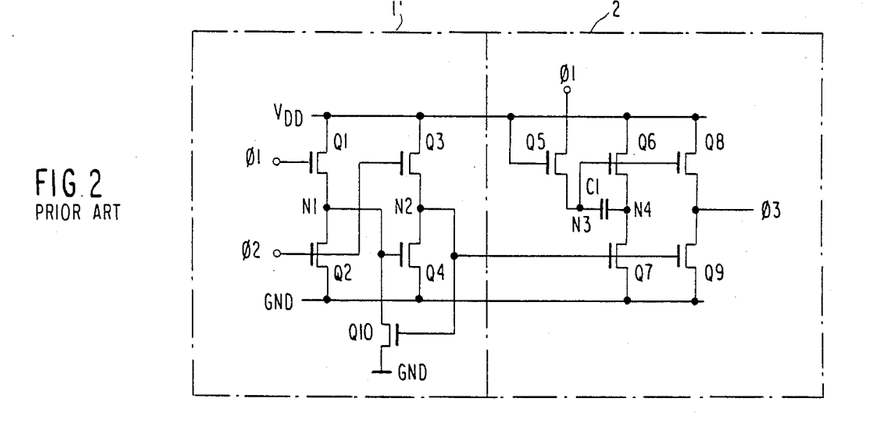
FIG. 2 is a circuit diagram of a proposed circuit for solving a problem associated with the circuit of FIG. 1.

FIG. 2 shows a semiconductor circuit which has been proposed for the purpose of eliminating the above-described problem. This circuit employs a MOST $Q_{10}$ having a drain connected to the node $N_1$, gate connected to the node $N_2$ and a source connected to the ground potential GND. The arrangement is such that, when the node $N_2$ is at the high level, the MOST $Q_{10}$ suppresses the high-impedance state of the node $N_1$ by the operation of MOST $Q_{10}$. Unfortunately, if the proper power ratio between the MOST $Q_1$ and $Q_{10}$ is not obtained, when the input signal $\phi_1$ is at the high level, the potential of the node $N_1$ cannot exceed the threshold voltage of the MOST $Q_4$ or at least the turn on of $Q_4$ will be delayed. From this point of view, it is necessary to reduce the conductance of the MOST $Q_{10}$ down to ⅛ to 1/10 of that of the MOST $Q_1$. In order to realize such a MOST on a chip, it is necessary to employ a multi-stage series connection of MOSTs or an increase of the channel legnth which more or less increases the chip area.

Figure 3:
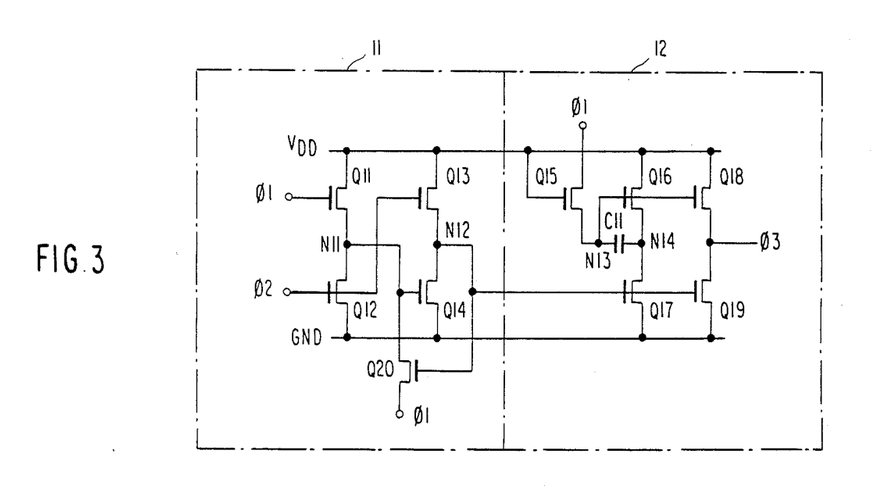
FIG. 3 is a circuit diagram of an embodiment of the invention.

FIG. 3 is a circuit diagram of a preferred embodiment of the invention and it consists of a delay circuit 11 and a drive circuit 12. The delay circuit 11 is composed of a MOST $Q_{11}$ having a gate connected to the input signal $\phi_1$, a drain connected to the power supply $V_{DD}$ and a source connected to a node $N_{11}$; a MOST $Q_{12}$ having a gate connected to the input signal $\phi_2$, a drain connected to a node $N_{11}$ and a source connected to the ground potential GND; a MOST $Q_{13}$ having a gate connected to the input signal $\phi_2$, a drain connected to a power supply $V_{DD}$ and a source connected to a node $N_{12}$; a MOST $Q_{14}$ having a gate connected to the node $N_{11}$, a drain connected to the node $N_{12}$ and the source connected to the ground potential GND; and a MOST $Q_{20}$ having a gate connected to the node $N_{12}$, a drain connected to the node $N_{11}$ and a source connected to the input signal $\phi_1$. The potential of the node $N_{12}$ falls with a certain delay after the rise of the input signal $\phi_1$.

The driver circuit 12 is composed of MOSTs $Q_{15}$ to $Q_{19}$ and a capacitor $C_{11}$ and is identical to the driver circuit 2 of FIG. 1. The driver circuit 12 includes a bootstrap circuit adapted to be driven by the input signal $\phi_1$ and making use of the output obtained at the node $N_{12}$ as the grounding-side control signal.

Thus, the circuit of this embodiment employs, in addition to the constituents of the conventional circuit shown in FIG. 1, a MOST $Q_{20}$ having a drain connected to the node $N_{11}$, a gate connected to the node $N_{12}$ and a source connected to the input signal $\phi_1$.

In the circuit of this embodiment, when the input signal $\phi_1$ is at the low level during the period between $T_2$ and $T_3$ (FIG. 4), MOST $Q_{20}$ will be on due to the high level of node $N_2$. The low level of the input signal $\phi_1$ connected to the source of MOST $Q_{20}$ insures that node $N_{11}$ is maintained at the ground level, thus avoiding the occurrence of a high-impedance state at the node $N_{11}$ during this time. When the input signal $\phi_1$ takes the high level, the node $N_{11}$ is promptly charged through the MOSTs $Q_{11}$ and $Q_{20}$. It is, therefore, not necessary at all to pay specific consideration to the ratio of power between the MOSTs $Q_{11}$ and $Q_{20}$. When the input signal $\phi_1$ takes the high level, the level of the gate of the MOST $Q_{20}$ is raised due to the self-bootstrap effect produced by the capacitances between the gate and drain and between the gate and source. Therefore, the level of the node $N_{12}$ is raised to reduce the on-resistance of the MOSTs $Q_{17}$ and $Q_{19}$ thereby achieveing a wave shaping effect through improvement in the pooling level of the node $N_{13}$ and through an improvement in the ratio of the output signal $d_3$. By making use of this remarkable effect, it is possible to adjust the delay of the output signal $d_3$ from the input signal $d_1$.

Figure 5:
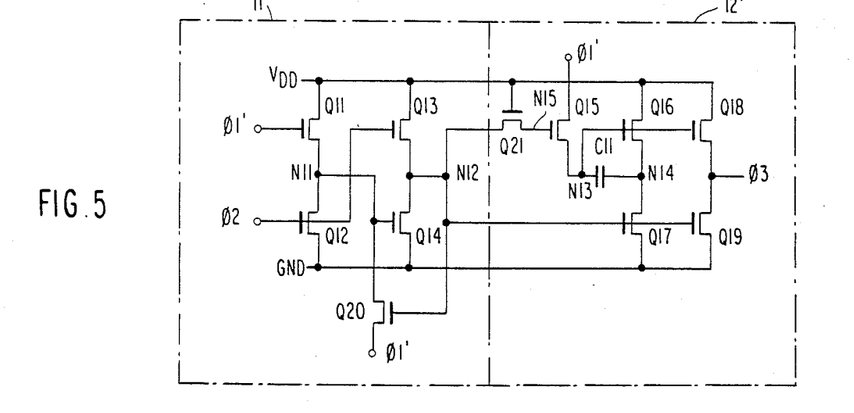
FIG. 5 is a circuit diagram of another embodiment of the invention.
Figure 6:
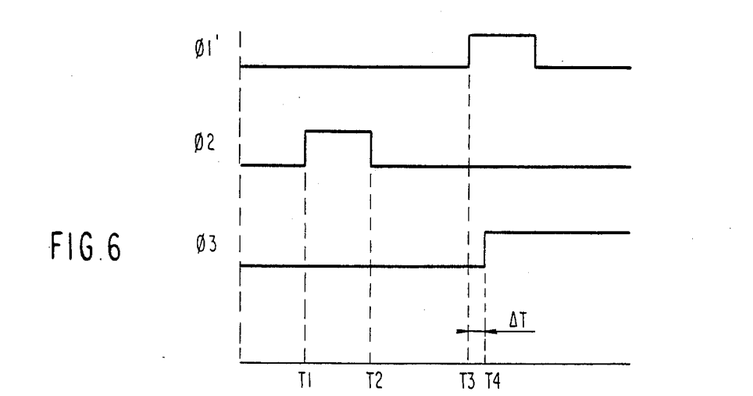
FIG. 6 is a time chart illustrating the operation of the embodiment shown in FIG. 5.

FIG. 5 is a circuit diagram of another embodiment of the invention, and FIG. 6 is a time chart which is useful to explain the operation of the embodiment shown in FIG. 5. In this embodiment the driver circuit 12' is different from that incorporated in the emboidment shown in FIG. 3. This driver circuit 12' additionally employs a MOST $Q_{21}$. When the input signal $d_1'$ changes to a high level, the MOST $Q_{14}$ is turned on so that the potential of the node $N_{12}$ is lowered to the ground level, thereby turning off the MOST $Q_{17}$. Therefore, the node $N_{13}$ can be maintained at the level above the power supply voltage $V_{DD}$ without depending upon the input signal $d_1'$. It is thus possible to obtain the output signal $d_3$ in response to the input signals $d_1'$ and $d_2$ shown in FIG. 6. More specifically, it is possible to obtain, as the signal $d_3$ ($\overline{Q_3}$) shown in FIG. 7, a frequency-divided signal which is obtained through ½ frequency division of the serial control signal $\overline{SC}$, having a duty ratio of 50%. Consequently, the periods of precharging of the data buses $DB_1$ and $DB_2$ are prolonged. The low level of the node 11 in the high-impedance state exists in the period between the moments $T_2$ and $T_3$ even under this condition, so that the advantage of the invention is ensured also in this case.

In the foregoing description of the embodiments, assumptions are made that the transistors are N-channel MOS transistors and that the high and low levels are logical "1" and "0", respectively These assumptions, however, are only illustrative and the invention can be applied to various logical semiconductor circuits making use of insulated gate type field effect transistors.

In the semiconductor circuit of the invention having the described construction, it is possible to prevent any undesirable rise of the low level of the node in the high-impedance state, without paying specific attention to the power ratio of the insulated gate type field effect transistors constituting the circuit.

I claim:

1. In a bootstrap type output circuit of the type having a delay section having a first series circuit of first and second field effect transistors coupled between power voltage sources, a second series circuit of third and fourth field effect transistors coupled between said power voltage sources, the gate of said first transistor receiving a first input signal, the gates of said second and third transistors receiving a second input signal, and means for connecting the gate of said fourth transistor to the intermediate junction of said first series circuit, a delay output signal from said delay section being the signal at the intermediate junction of said second series circuit; and a buffer section having a bootstrap capacitor and means for operatively charging said capacitor in response to said delay output signal, the improvement comprising, means for operatively setting the level of said gate of said fourth transistor to the level of said first input signal in response to said delay output signal.

2. The invention as claimed in claim 1, wherein said setting means includes a fifth field effect transistor having a gate receiving said delay output signal and a source-drain path coupled between said gate of said fourth transistor and said first input signal.

3. The invention as claimed in claim 2, wherein said buffer section includes a sixth field effect transistor having a drain coupled to one of said voltage sources, a source coupled to one end of said capacitor and a gate coupled to the other end of said capacitor.

4. The invention as claimed in claim 3, wherein said buffer section further includes a seventh field effect transistor coupled between the gate of said sixth transistor and said first input signal.

5. The invention as claimed in claim 4, wherein the gate of said seventh transistor is supplied with one of said voltage sources.

6. The invention as claimed in claim 4, wherein said buffer section further includes an eight field effect transistor coupled between said gate of said seventh transistor and said intermediate junction of said second series circuit.

7. The invention as claimed in claim 6, wherein said charging means includes a ninth field effect transistor coupled between said one end of said capacitor and the other of said voltage sources.

8. The invention as claimed in claim 7, wherein said buffer section further includes a third series circuit of tenth and eleventh field effect transistors coupled between said voltage sources and means for connecting the gate of said tenth transistor to said the other end of said capacitor.

9. A bootstrap circuit comprising: a delay circuit having a first field effect transistor having a gate receiving a first input signal, a drain connected to a power supply and a source connected to a first node, a second field effect transistor having a gate receiving a second input signal, a drain connected to said first node and a source connected to a reference potential a third field effect transistor having a gate receiving said second input signal, a drain connected to said power supply and a source connected to a second node, a fourth field effect transistor having a gate connected to said first node, a drain connected to said second node and a source connected to said reference potential, and a fifth field effect transistor having a gate connected to said second node, a drain connected to said first node and a source receiving said first input signal, said delay circuit generating an output from said second node the level of which falls with a predetermined delay after the rise of said first input signal; and a driver circuit including a bootstrap capacitor and a bootstrap circuit which makes use of the output of said delay circuit for controlling charging of said bootstrap capacitor.

10. The circuit according to claim 9, wherein said driver circuit includes a sixth field effect transistor coupled between said power supply and one end of said capacitor and having a gate coupled ot the other end of said capacitor, and a seventh field effect transistor coupled between said one end of said capacitor and said reference potential and having a gate receiving said output of said delay circuit.

11. The circuit according to claim 10, wherein said driver circuit further includes an eighth field effect transistor coupled between the other end of said capacitor and said first input signal.

12. The circuit according to claim 11, wherein the gate of said eight transistor is connected to said power supply.

13. The circuit according to claim 11, further comprising a ninth field effect transistor coupled between the gate of said eighth transistor and said output of said delay circuit and having a gate coupled to said power supply.

* * * * *

UNITED STATES PATENT AND TRADEMARK OFFICE
CERTIFICATE OF CORRECTION

PATENT NO. : 4,633,105
DATED : December 30, 1986
INVENTOR(S) : Akira TSUJIMOTO

It is certified that error appears in the above-identified patent and that said Letters Patent is hereby corrected as shown below:

Column 2, line 42, delete "poewr" insert --power--;

Column 3, line 3, delete "Q6" and insert --$Q_6$--;

line 25, delete "sujected" and insert --subjected--;

line 47, delete "stroke" and insert --strobe--.

Column 4, line 24, delete "(E.G.," and insert --(e.g.,--;

line 38, delete "$\varphi_3$" and insert --$\overline{\varphi}_3$--;

line 40, delete "$\varphi_3$" and insert --$\overline{\varphi}_3$--.

Column 5, line 17, delete "SFTB" and insert --SHFTB--;

line 36, delete "$\varphi_3$" (second occurrence) and insert --$\overline{\varphi}_3$--;

line 42, delete "$\varphi_3$" and insert --$\overline{\varphi}_3$--.

UNITED STATES PATENT AND TRADEMARK OFFICE
CERTIFICATE OF CORRECTION

PATENT NO. : 4,633,105

DATED : December 30, 1986

INVENTOR(S) : Akira TSUJIMOTO

It is certified that error appears in the above-identified patent and that said Letters Patent is hereby corrected as shown below:

Column 8, line 31, after "potential" insert --,--;

line 50, delete "ot" and insert --to--.

Signed and Sealed this

Twenty-sixth Day of April, 1988

Attest:

DONALD J. QUIGG

Attesting Officer

Commissioner of Patents and Trademarks